(12) United States Patent
Wei et al.

(10) Patent No.: US 8,558,217 B2
(45) Date of Patent: Oct. 15, 2013

(54) LIGHT EMITTING DIODE

(75) Inventors: Yang Wei, Beijing (CN); Shou-Shan Fan, Beijing (CN)

(73) Assignees: Tsinghua University, Beijing (CN); Hon Hai Precision Industry Co., Ltd., New Taipei (TW)

( * ) Notice: Subject to any disclaimer, the term of this patent is extended or adjusted under 35 U.S.C. 154(b) by 29 days.

(21) Appl. No.: 13/288,222

(22) Filed: Nov. 3, 2011

(65) Prior Publication Data

US 2012/0273756 A1   Nov. 1, 2012

(30) Foreign Application Priority Data

Apr. 29, 2011   (CN) .......................... 2011 1 0110801

(51) Int. Cl.
| | |
|---|---|
| *H01L 33/00* | (2010.01) |
| *H01L 27/15* | (2006.01) |
| *H01L 21/00* | (2006.01) |
| *H01L 29/06* | (2006.01) |

(52) U.S. Cl.
USPC .................. 257/13; 257/79; 257/86; 257/94; 257/99; 257/103; 257/E33.001; 257/E33.01; 257/E33.013; 257/E33.055; 438/22; 438/23; 438/27; 438/29

(58) Field of Classification Search
None
See application file for complete search history.

(56) References Cited

U.S. PATENT DOCUMENTS

| 8,022,425 B2* | 9/2011 | Yao et al. ......................... 257/98 |
| 2009/0218583 A1* | 9/2009 | Ishida et al. .................... 257/98 |
| 2010/0221852 A1* | 9/2010 | Li et al. ............................ 438/22 |
| 2012/0056237 A1* | 3/2012 | Choi et al. ..................... 257/103 |

* cited by examiner

*Primary Examiner* — Julio J Maldonado
*Assistant Examiner* — Harpreet Singh
(74) *Attorney, Agent, or Firm* — Altis & Wispro Law Group, Inc.

(57) ABSTRACT

A light emitting diode includes a substrate, a carbon nanotube layer, a first semiconductor layer, an active layer, a second semiconductor layer, a first electrode, and a second electrode. The first semiconductor layer, the active layer, and the second semiconductor layer are stacked on one side of the substrate in that order. The first semiconductor layer is adjacent to the substrate. The carbon nanotube layer is located between the first semiconductor layer and the substrate. The first electrode is electrically connected to the first semiconductor layer. The second electrode is electrically connected to the second semiconductor layer.

20 Claims, 8 Drawing Sheets

LIGHT EMITTING DIODE

CROSS-REFERENCE TO RELATED APPLICATIONS

This application claims all benefits accruing under 35 U.S.C. §119 from China Patent Application No. 201110110801.X, filed on Apr. 29, 2011, in the China Intellectual Property Office, the contents of which are hereby incorporated by reference. This application is related to commonly-assigned applications entitled "METHOD FOR MAKING LIGHT EMITTING DIODE", filed Nov. 3, 2011 Ser. No. 13/288,174; "LIGHT EMITTING DIODE", filed Nov. 3, 2011 Ser. No. 13/288,180; "METHOD FOR MAKING LIGHT EMITTING DIODE", filed Nov. 3, 2011 Ser. No. 13/288,183; "LIGHT EMITTING DIODE", filed Nov. 3, 2011 Ser. No. 13/288,187; "METHOD FOR MAKING LIGHT EMITTING DIODE", filed Nov. 3, 2011 Ser. No. 13/288,192; "LIGHT EMITTING DIODE", filed Nov. 3, 2011 Ser. No. 13/288,327; "LIGHT EMITTING DIODE", filed Nov. 3, 2011 Ser. No. 13/288,203; "METHOD FOR MAKING LIGHT EMITTING DIODE", filed Nov. 3, 2011 Ser. No. 13/288,213; "METHOD FOR MAKING LIGHT EMITTING DIODE", filed Nov. 3, 2011 Ser. No. 13/288,234; "LIGHT EMITTING DIODE", filed Nov. 3, 2011 Ser. No. 13/288,238; "METHOD FOR MAKING LIGHT EMITTING DIODE", filed Nov. 3, 2011 Ser. No. 13/288,246. The disclosures of the above-identified applications are incorporated herein by reference.

BACKGROUND

1. Technical Field

The present disclosure relates to a light emitting diode (LED) and method for making the same.

2. Description of Related Art

In recent years, highly efficient LEDs made with GaN-based semiconductors have become widely used in different technologies, such as in display devices, large electronic billboards, street lights, car lights, and other illumination applications. LEDs are environmentally friendly, have a long working life, and low power consumption.

A conventional LED commonly includes an N-type semiconductor layer, a P-type semiconductor layer, an active layer, an N-type electrode, and a P-type electrode. The active layer is located between the N-type semiconductor layer and the P-type semiconductor layer. The P-type electrode is located on the P-type semiconductor layer. The N-type electrode is located on the N-type semiconductor layer. Typically, the P-type electrode is transparent. In operation, a positive voltage and a negative voltage are applied respectively to the P-type semiconductor layer and the N-type semiconductor layer. Thus, cavities in the P-type semiconductor layer and electrons in the N-type semiconductor layer can enter the active layer and combine with each other to emit visible light.

However, extraction efficiency of LEDs is low because typical semiconductor materials have a higher refractive index than that of air. Large-angle light emitted from the active layer may be internally reflected in LEDs, so that a large portion of the light emitted from the active layer remains in the LEDs, thereby degrading the extraction efficiency.

What is needed, therefore, is a LED which can overcome the above-described shortcomings.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
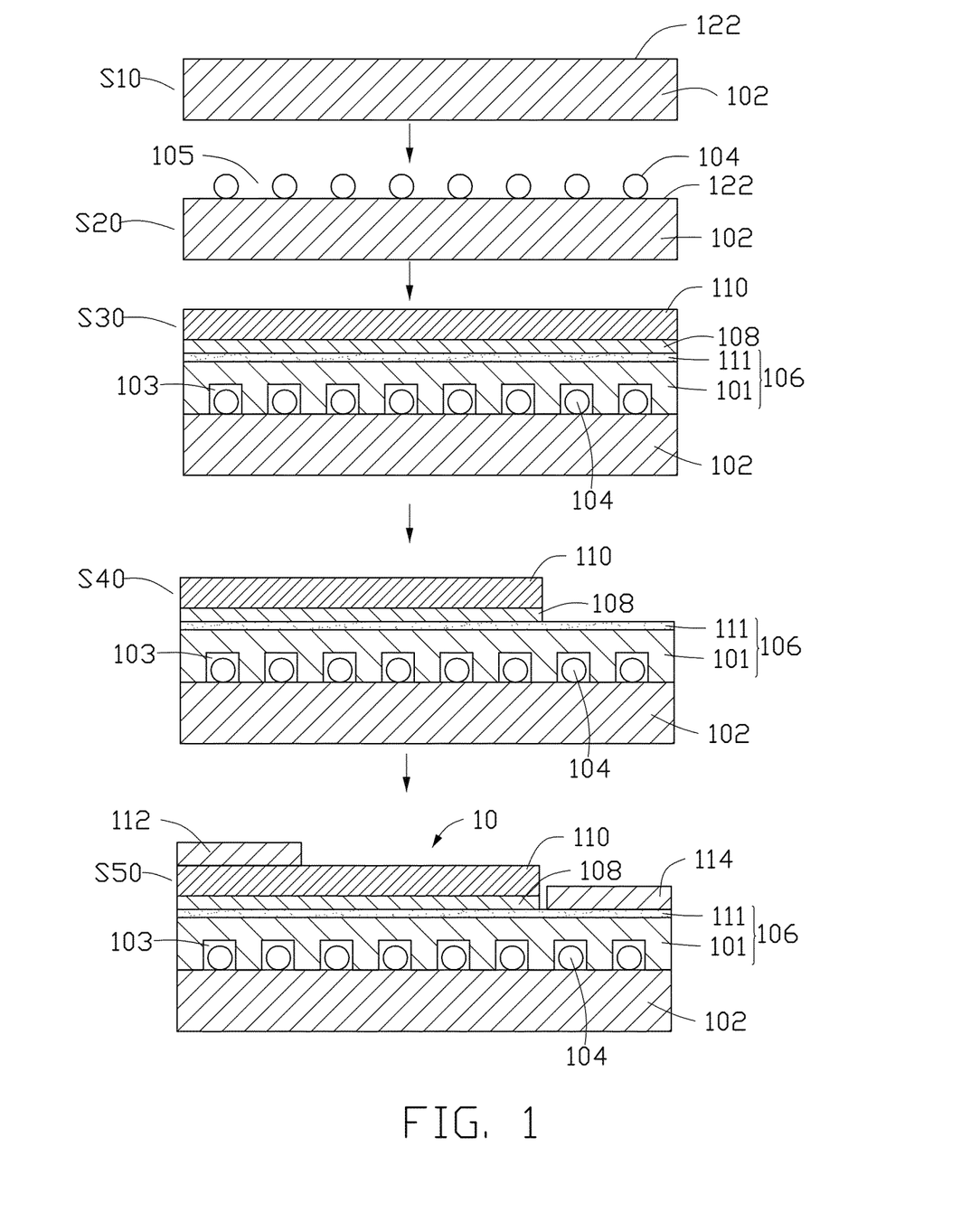
FIG. 1 is a flow chart of one embodiment of a method for making a LED.

Referring to FIG. 1, a method for making an LED of one embodiment includes the following steps:

S10: providing a substrate 102 having an epitaxial growth surface 122;

S20: placing a carbon nanotube layer 104 on the epitaxial growth surface 122;

S30: growing a first semiconductor layer 106, an active layer 108, and a second semiconductor layer 110 on the epitaxial growth surface 122;

S40: etching a portion of the second semiconductor layer 110 and the active layer 108 to expose a portion of the first semiconductor layer 106; and S50: preparing a first electrode 114 on the first semiconductor layer 106 and preparing a second electrode 112 on the second semiconductor layer 110.

In step S10, the epitaxial growth surface 122 can be used to grow the first semiconductor layer 106. The epitaxial growth surface 122 is a clean and smooth surface. The substrate 102 can be made of a transparent material. The substrate 102 is used to support the first semiconductor layer 106. The substrate 102 can be a single-layer structure or a multi-layered structure. If the substrate 102 is a single-layer structure, the substrate 102 can be a single crystal structure having a crystal face. The crystal face can be used as the epitaxial growth surface 122. If the substrate 102 is a single-layer crystal structure, the material of the substrate 102 can be made of SOI (silicon on insulator), $LiGaO_2$, $LiAlO_2$, $Al_2O_3$, Si, GaAs, GaN, GaSb, InN, InP, InAs, InSb, AlP, AlAs, AlSb, AlN, Apertuer, SiC, SiGe, GaMnAs, GaAlAs, GaInAs, GaAlN, GaInN, AlInN, GaAsP, InGaN, AlGaInN, AlGaInP, Apertuer: Zn or Apertuer:N. If the substrate 102 is a multi-layer structure, the substrate 102 should include at least one layer of the above-described single crystal structure having a crystal face. The material of the substrate 102 can be selected according to the material of the first semiconductor layer 106, which will be grown on the substrate 102 in step S30. The size, thickness and shape of the substrate 102 can be selected according to need. In one embodiment, the substrate 102 is made of sapphire.

In step S20, the carbon nanotube layer 104 includes a number of carbon nanotubes. A thickness of the carbon nanotube layer 104 is in a range from 1 nm to 100 µm, for example, about 1 nm, 10 nm, 200 nm, 1 µm, or 10 µm. In one embodiment, the thickness of the carbon nanotube layer 104 is about 100 nm. The length and diameter of the carbon nanotubes in the carbon nanotube layer 104 are selected according to need. The carbon nanotubes in the carbon nanotube layer 104 can be single-walled, double-walled, multi-walled carbon nanotubes, or combinations thereof.

The carbon nanotube layer 104 forms a pattern so part of the epitaxial growth surface 122 can be exposed from the patterned carbon nanotube layer 104 after the carbon nanotube layer 104 is placed on the epitaxial growth surface 122. Thus, the first semiconductor layer 106 can grow from the exposed epitaxial growth surface 122.

The patterned carbon nanotube layer 104 defines a number of apertures 105. The apertures 105 are dispersed uniformly. The apertures 105 extend through the carbon nanotube layer 104 along a thickness direction of the carbon nanotube layer 104. Therefore, the carbon nanotube layer 104 is a graphical structure. The carbon nanotube layer 104 covers the epitaxial growth surface 122 of the substrate 102. A portion of the epitaxial growth surface 122 is then exposed from the apertures 105 of the carbon nanotube layer 104, and the first semiconductor layer 106 grows from the apertures 105 of the carbon nanotube layer 104. The aperture 105 can be a hole defined by several adjacent carbon nanotubes, or a gap defined by two substantially parallel carbon nanotubes and extending along axial directions of the carbon nanotubes. The size of the apertures 105 can be the diameter of the hole or width of the gap, and can be in a range from about 10 nm to about 500 µm. The hole-shaped apertures 105 and the gap-shaped apertures 105 can exist in the patterned carbon nanotube layer 104 at the same time. The sizes of the apertures 105 can be different. The smaller the sizes of the apertures 105, the less dislocation defects will occur during the process of growing first semiconductor layer 106. In one embodiment, the sizes of the apertures 105 are in a range from about 10 nm to about 10 µm. The duty factor of the carbon nanotube layer 104 is an area ratio between the sheltered epitaxial growth surface 122 and the exposed epitaxial growth surface 122. The duty factor of the carbon nanotube layer 104 can be in a range from about 1:100 to about 100:1, for example, about 1:10, 1:2, 1:4, 4:1, 2:1 or 10:1. In one embodiment, the duty factor of the carbon nanotube layer 104 is in a range from about 1:4 to about 4:1.

Figure 2:
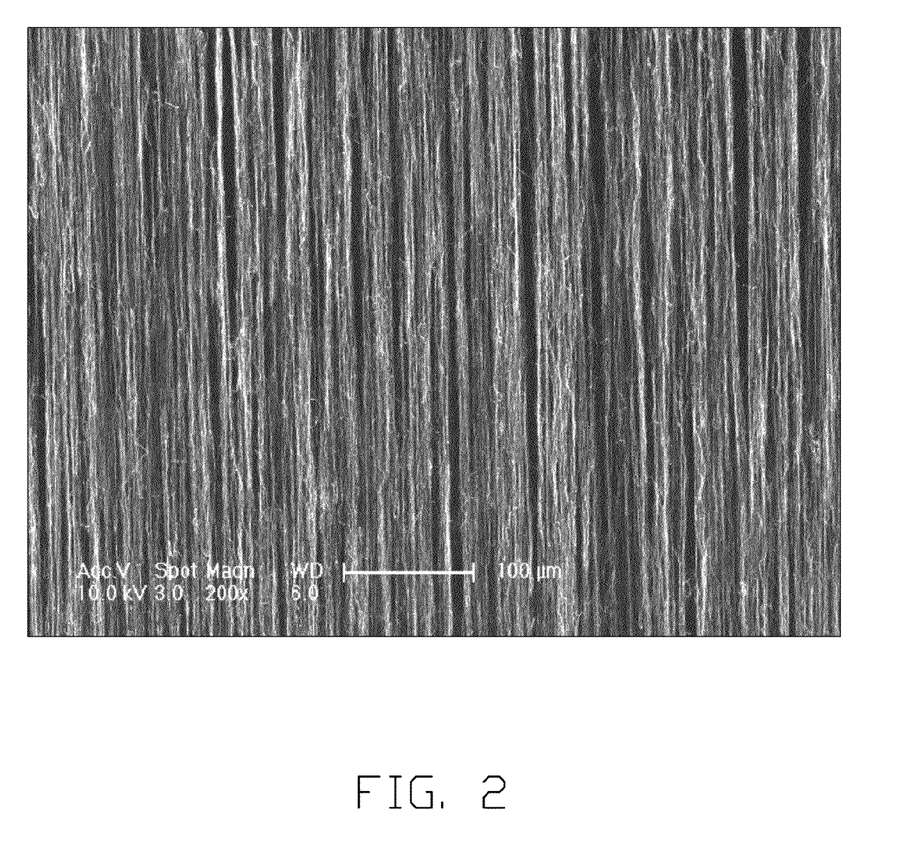
FIG. 2 is a Scanning Electron Microscope (SEM) image of a drawn carbon nanotube film used in the method of FIG. 1.
Figure 4:
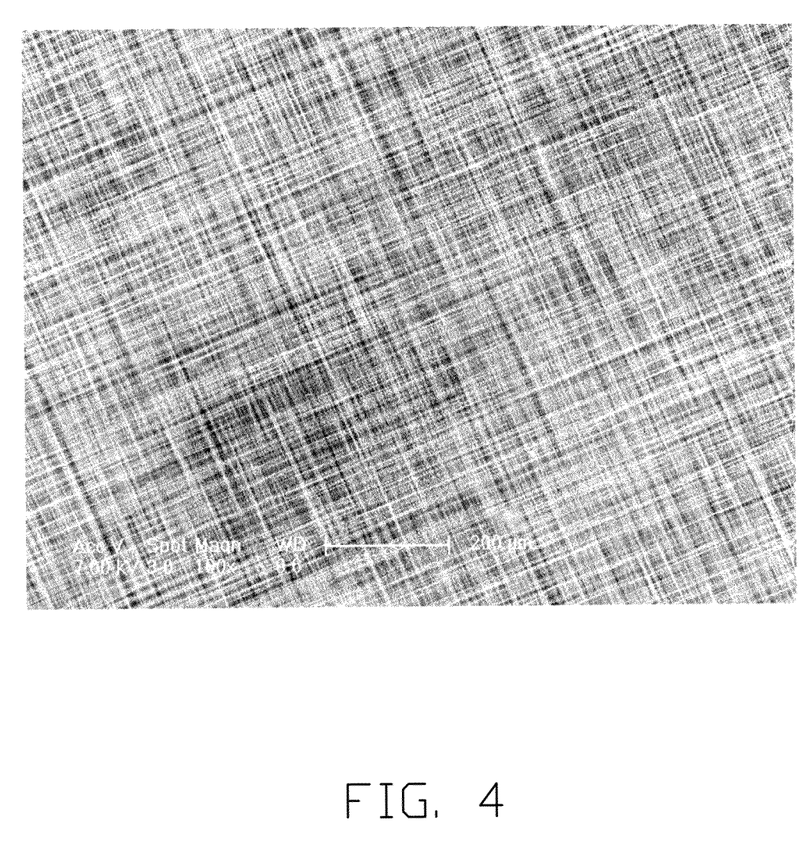
FIG. 4 is a SEM image of cross-stacked drawn carbon nanotube films used in the method of FIG. 1.

In one embodiment, the carbon nanotubes in the carbon nanotube layer 104 are arranged to extend along a direction substantially parallel to the surface of the carbon nanotube layer 104 to obtain a better pattern and greater light transmission. After being placed on the epitaxial growth surface 122, the carbon nanotubes in the carbon nanotube layer 104 are arranged to extend along the direction substantially parallel to the epitaxial growth surface 122. Referring to FIG. 2, all the carbon nanotubes in the carbon nanotube layer 104 are arranged to extend substantially along the same direction. Referring to FIG. 4, part of the carbon nanotubes in the carbon nanotube layer 104 are arranged to extend along a first direction. The other part of the carbon nanotubes in the carbon nanotube layer 104 are arranged to extend along a second direction, perpendicular to the first direction. Also the carbon nanotubes in the ordered carbon nanotube structure can be arranged to extend along the crystallographic orientation of the substrate 102 or along a direction that forms an angle with the crystallographic orientation of the substrate 102.

The carbon nanotube layer 104 can be formed on the epitaxial growth surface 122 by chemical vapor deposition (CVD), transfer printing a preformed carbon nanotube film, filtering or depositing a carbon nanotube suspension. In one embodiment, the carbon nanotube layer 104 is a free-standing structure and can be drawn from a carbon nanotube array. The term "free-standing structure" means that the carbon nanotube layer 104 can sustain the weight of itself when it is hoisted by a portion thereof without any significant damage to its structural integrity. Thus, the carbon nanotube layer 104 can be suspended by two spaced supports. The free-standing carbon nanotube layer 104 can be laid on the epitaxial growth surface 122 directly and easily.

The carbon nanotube layer 104 can be a continuous structure or a discontinuous structure. The discontinuous carbon nanotube layer 104 includes a number of carbon nanotube wires substantially parallel to each other. If the carbon nanotube layer 104 has carbon nanotube wires substantially parallel to each other and a supporting force is applied to the carbon nanotube layer 104 in a direction substantially perpendicular to axial directions of the carbon nanotube wires, the parallel carbon nanotube wires can form a free-standing structure. The successive carbon nanotubes are joined end to end by van der Waals attractive force in a direction substantially parallel to an axial direction of the carbon nanotube. The carbon nanotubes are connected with each other by van der Waals attractive force in a direction substantially perpendicular to an axial direction of the carbon nanotubes.

The carbon nanotube layer 104 can be a substantially pure structure of the carbon nanotubes, with few impurities and chemical functional groups. The carbon nanotube layer 104 can be a composite including a carbon nanotube matrix and non-carbon nanotube materials. The non-carbon nanotube materials can be graphite, graphene, silicon carbide, boron nitride, silicon nitride, silicon dioxide, diamond, amorphous carbon, metal carbides, metal oxides, or metal nitrides. The non-carbon nanotube materials can be coated on the carbon nanotubes of the carbon nanotube layer 104 or filled in the apertures 105. In one embodiment, the non-carbon nanotube materials are coated on the carbon nanotubes of the carbon nanotube layer 104 so the carbon nanotubes can have greater diameter and the apertures 105 can have smaller sizes. The non-carbon nanotube materials can be deposited on the carbon nanotubes of the carbon nanotube layer 104 by CVD or physical vapor deposition (PVD), such as sputtering.

Furthermore, the carbon nanotube layer 104 can be treated with an organic solvent after being placed on the epitaxial growth surface 122 so the carbon nanotube layer 104 can be attached on the epitaxial growth surface 122 firmly. Specifically, the organic solvent can be applied to the entire surface of the carbon nanotube layer 104 or the entire carbon nanotube layer 104 can be immerged in an organic solvent. The organic solvent can be volatile, such as ethanol, methanol, acetone, dichloroethane, chloroform, or mixtures thereof. In one embodiment, the organic solvent is ethanol.

The carbon nanotube layer 104 can include at least one carbon nanotube film, at least one carbon nanotube wire, or a combination thereof. In one embodiment, the carbon nanotube layer 104 can include a single carbon nanotube film or two or more stacked carbon nanotube films. Thus, the thickness of the carbon nanotube layer 104 can be controlled by the number of the stacked carbon nanotube films. The number of the stacked carbon nanotube films can be in a range from about 2 to about 100, such as about 10 layers, 30 layers, or 50 layers. In one embodiment, the carbon nanotube layer 104 can include a layer of substantially parallel and spaced carbon nanotube wires. Also, the carbon nanotube layer 104 can include a plurality of carbon nanotube wires crossed or weaved together to form a carbon nanotube net. The distance between two adjacent parallel and spaced carbon nanotube wires can be in a range from about 0.1 µm to about 200 µm. In one embodiment, the distance between two adjacent parallel and spaced carbon nanotube wires can be in a range from about 10 µm to about 100 µm. The size of the apertures 105 can be controlled by the distance between two adjacent parallel and spaced carbon nanotube wires. The length of the gap between two adjacent parallel carbon nanotube wires can be equal to the length of the carbon nanotube wire. It is understood that any carbon nanotube structure described can be used with all embodiments.

A drawn carbon nanotube film is composed of a plurality of carbon nanotubes. A large majority of the carbon nanotubes in the drawn carbon nanotube film can be oriented along a preferred orientation, meaning that a large majority of the carbon nanotubes in the drawn carbon nanotube film are arranged substantially along the same direction. An end of one carbon nanotube is joined to another end of an adjacent carbon nanotube arranged substantially along the same direction by van der Waals attractive force. The drawn carbon nanotube film is capable of forming a freestanding structure. The successive carbon nanotubes joined end to end by van der Waals attractive force realizes the freestanding structure of the drawn carbon nanotube film.

Some variations can occur in the orientation of the carbon nanotubes in the drawn carbon nanotube film. Microscopically, the carbon nanotubes oriented substantially along the same direction may not be perfectly aligned in a straight line, and some curve portions may exist. It can be understood that a contact between some carbon nanotubes located substantially side by side and oriented along the same direction cannot be totally excluded.

The structure of the drawn carbon nanotube film and the method for making the drawn carbon nanotube film is illustrated as follows.

Figure 3:
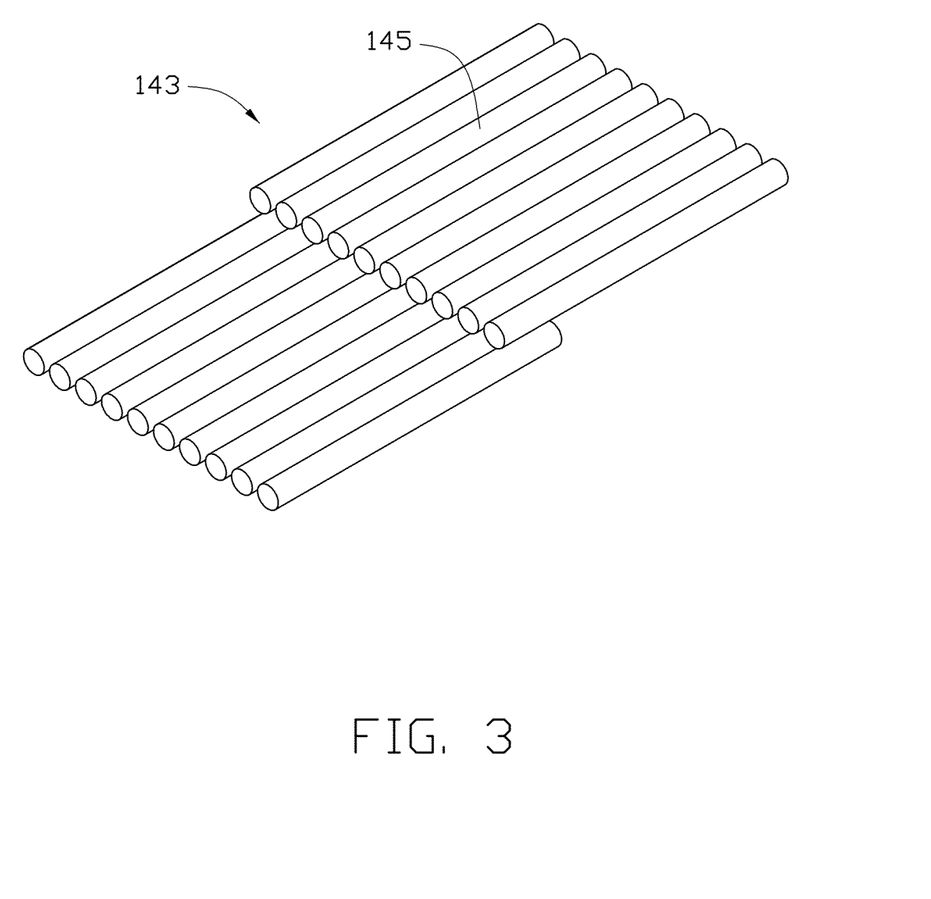
FIG. 3 is a schematic structural view of a carbon nanotube segment of the drawn carbon nanotube film of FIG. 2.

Referring to FIGS. 2 and 3, each drawn carbon nanotube film includes a plurality of successively oriented carbon nanotube segments 143 joined end-to-end by van der Waals attractive force therebetween. Each drawn carbon nanotube segment 143 includes a plurality of carbon nanotubes 145 substantially parallel to each other, and combined by van der Waals attractive force therebetween. The drawn carbon nanotube segments 143 can vary in width, thickness, uniformity and shape. The carbon nanotubes in the drawn carbon nanotube film are also substantially oriented along a preferred orientation. A thickness of the drawn carbon nanotube film can range from about 1 nanometer to about 100 µm in one embodiment. The thickness of the drawn carbon nanotube film can range from about 100 nm to about 10 µm in another embodiment. A width of the drawn carbon nanotube film relates to the carbon nanotube array from which the drawn carbon nanotube film is drawn. The apertures between the carbon nanotubes in the drawn carbon nanotube film can form the apertures 105 in the carbon nanotube layer 104. The apertures between the carbon nanotubes in the drawn carbon nanotube film can be less than 10 µm. Examples of the drawn carbon nanotube film are taught by U.S. Pat. No. 7,045,108 to Jiang et al., and WO 2007015710 to Zhang et al.

Figure 6:
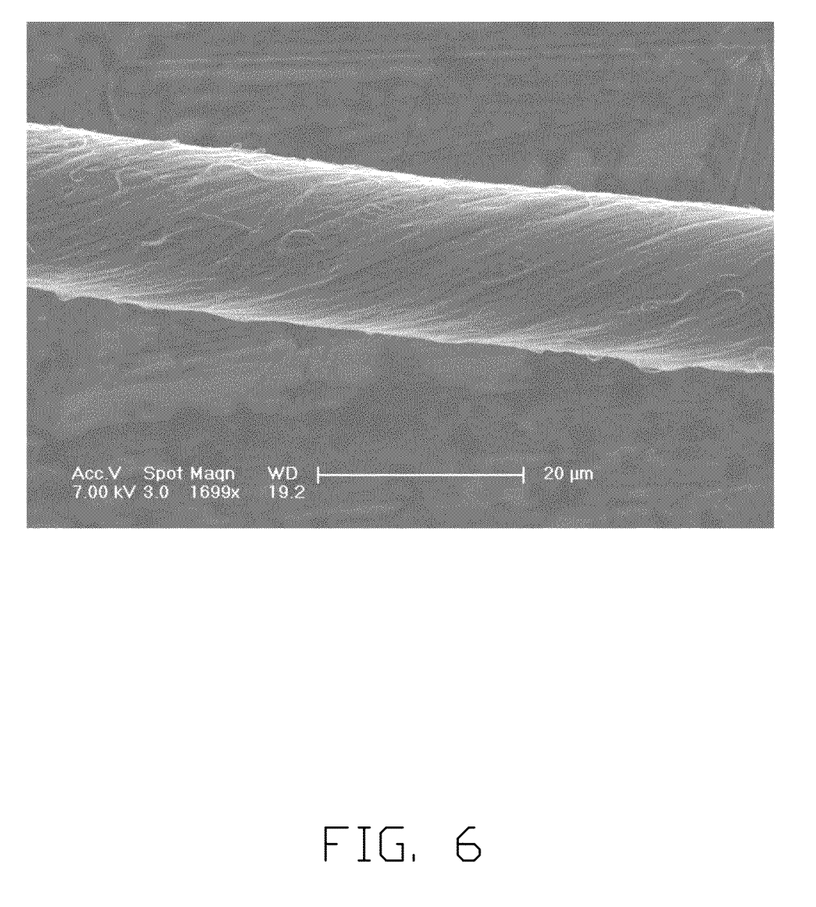
FIG. 6 is a SEM image of twisted carbon nanotube wires used in the method of FIG. 1.

The carbon nanotube layer 104 includes at least two drawn carbon nanotube films stacked with each other. In other embodiments, the carbon nanotube layer 104 can include two or more coplanar carbon nanotube films, and each coplanar carbon nanotube film can include multiple layers. Additionally, when the carbon nanotubes in the carbon nanotube film are aligned along one preferred orientation (e.g., the drawn carbon nanotube film), an angle can exist between the orientation of carbon nanotubes in adjacent films, whether stacked or adjacent. Adjacent carbon nanotube films are combined by van der Waals attractive force therebetween. An angle between the aligned directions of the carbon nanotubes in the two adjacent drawn carbon nanotube films can range from about 0 degrees to about 90 degrees ($0° \leq \alpha \leq 90°$). If $\alpha=0°$, the two adjacent drawn carbon nanotube films are arranged in the same direction with each other. If the angle between the aligned directions of the carbon nanotubes in adjacent stacked drawn carbon nanotube films is larger than 0 degrees, a plurality of micropores is defined by the carbon nanotube layer 104. Referring to FIG. 6, the carbon nanotube layer 104 shown with the angle between the aligned directions of the carbon nanotubes in adjacent stacked drawn carbon nanotube films is 90 degrees. The stacked drawn carbon nanotube films can improve the strength and maintain the shape of the carbon nanotube layer 104. Stacking the carbon nanotube films also increases the structural integrity of the carbon nanotube layer 104.

Furthermore, the carbon nanotube layer 104 can be heated to decrease the thickness of the carbon nanotube layer 104. When the carbon nanotube layer 104 is heated, the carbon nanotubes with larger diameter will absorb more energy and be destroyed. The carbon nanotube layer 104 can be heated locally to protect the carbon nanotube layer 104 from damage. In one embodiment, the carbon nanotube layer 104 is heated by the following steps: (1) dividing a surface of the carbon nanotube layer 104 into a number of local areas; (2) heating all of the local areas of the carbon nanotube layer 104 one by one. The carbon nanotube layer 104 can be heated by a laser or a microwave. In one embodiment, the carbon nanotube layer 104 is heated by the laser and a power density of the laser is greater than $0.1 \times 10^4$ W/m$^2$.

The laser can irradiate the carbon nanotube layer 104 in many ways. The direction of the laser can be substantially perpendicular to the surface of the carbon nanotube layer 104. The moving direction of the laser can be substantially parallel or perpendicular to axial directions of the carbon nanotubes in the carbon nanotube layer 104. For a laser with a stable power density and wavelength, the slower the moving speed of the laser, the more carbon nanotubes of the carbon nanotube layer 104 will be destroyed, and the thinner the carbon nanotube layer 104. However, if the speed is too slow, the carbon nanotube layer 104 will be completely destroyed. In the present embodiment, a power density of the laser is $0.053 \times 10^{12}$ W/m$^2$, a diameter of the irradiating pattern of the laser is in a ranges from about 1 mm to about 5 mm, wherein a time of laser irradiation is less than 1.8 seconds. In the present embodiment, the laser is a carbon dioxide laser and the power density of the laser is about 30 W. A wavelength of the laser is about 10.6 microns. The diameter of the irradiating pattern of the laser is about 3 mm. A moving speed of the laser device is less than 10 meters/second.

Figure 5:
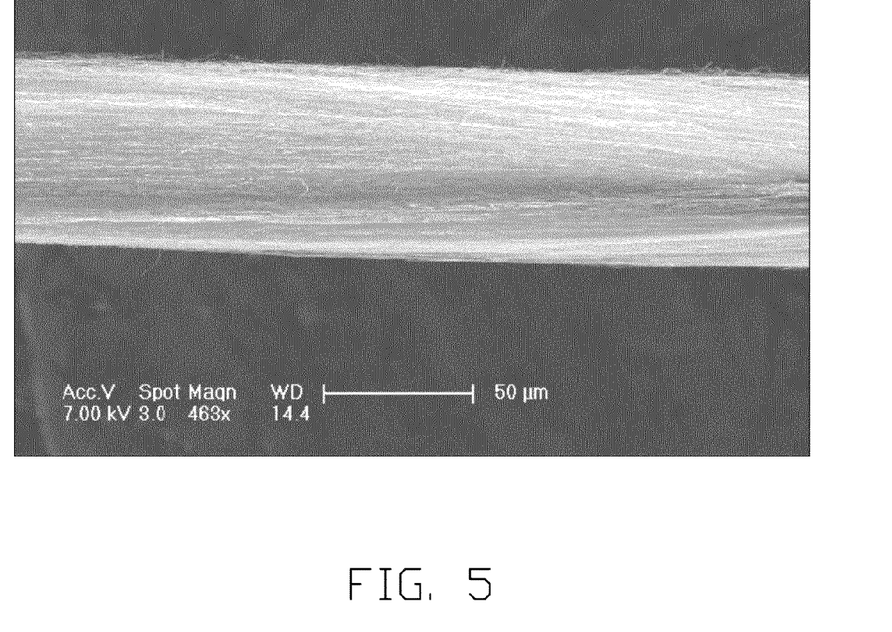
FIG. 5 is a SEM image of untwisted carbon nanotube wires used in the method of FIG. 1.

The carbon nanotube wire can be an untwisted carbon nanotube wire or twisted carbon nanotube wire. Both of the untwisted carbon nanotube wire or twisted carbon nanotube wire can be a free-standing structure. Referring to FIG. 5, the untwisted carbon nanotube wire includes a plurality of carbon nanotubes substantially oriented along a direction along the length of the untwisted carbon nanotube wire. More specifically, the untwisted carbon nanotube wire includes a plurality of successive carbon nanotube treated segments joined end to end by van der Waals attractive force therebetween. Each carbon nanotube treated segment includes a plurality of carbon nanotubes substantially parallel to each other, and combined by van der Waals attractive force therebetween. The carbon nanotube treated segments can vary in width, thickness, uniformity, and shape. The length of the untwisted carbon nanotube wire can be arbitrarily set as desired. A diameter of the untwisted carbon nanotube wire can be in an range from about 0.5 nm to about 100 μm. The untwisted carbon nanotube wire is formed by treating the carbon nanotube film with an organic solvent. Specifically, the carbon nanotube film is treated by applying the organic solvent to the carbon nanotube film to soak the entire surface of the carbon nanotube film. After being soaked by the organic solvent, the adjacent paralleled carbon nanotubes in the carbon nanotube film will bundle together due to the surface tension of the organic solvent as the organic solvent volatilizes, and thus, the carbon nanotube film will be shrunk into untwisted carbon nanotube wire.

The twisted carbon nanotube wire is formed by twisting a carbon nanotube film by using a mechanical force to turn the two ends of the carbon nanotube film in opposite directions. Referring to FIG. 6, the twisted carbon nanotube wire includes a plurality of carbon nanotubes oriented around an axial direction of the twisted carbon nanotube wire. The carbon nanotubes are aligned around the axis of the carbon nanotube twisted wire like a helix. Specifically, the twisted carbon nanotube wire includes a plurality of successive carbon nanotube segments joined end to end by van der Waals attractive force therebetween. Each carbon nanotube segment includes a plurality of carbon nanotubes substantially parallel to each other, and combined by van der Waals attractive force therebetween. The carbon nanotube segments can vary in width, thickness, uniformity, and shape. The length of the carbon nanotube wire can be arbitrarily set as desired. A diameter of the twisted carbon nanotube wire can be in an range from about 0.5 nm to about 100 μm.

Furthermore, the twisted carbon nanotube wire can be treated with the volatile organic solvent. After being soaked by the organic solvent, the adjacent paralleled carbon nanotubes in the twisted carbon nanotube wire will bundle together, due to the surface tension of the organic solvent when the organic solvent volatilizing. The specific surface area of the twisted carbon nanotube wire will decrease, and the density and strength of the twisted carbon nanotube wire will increase. Examples of the carbon nanotube wire are taught by U.S. Pat. No. 7,045,108 to Jiang et al., and US 20100173037 A1 to Jiang et al.

As discussed above, the carbon nanotube layer 104 can be used as a mask for growing the first epitaxial layer 122. The term 'mask' for growing the first epitaxial layer 122 means that the carbon nanotube layer 104 can be used to shelter part of the epitaxial growth surface 122 and expose the other part of the epitaxial growth surface 122. Thus, the first epitaxial layer 122 can grow from the exposed epitaxial growth surface 122. The carbon nanotube layer 104 can form a patterned mask on the epitaxial growth surface 122 because the carbon nanotube layer 104 defines a plurality of first apertures 105. Compared to lithography or etching, the method of forming a carbon nanotube layer 104 as mask is simple, low in cost, and will not pollute the substrate 102.

In step S30, the first semiconductor layer 106, the active layer 108 and the second semiconductor layer 110 are grown in sequence by a molecular beam epitaxy (MBE), chemical beam epitaxy (CBE), vacuum epitaxy, low temperature epitaxy, selective epitaxy, liquid phase deposition epitaxy (LPE), metal organic vapor phase epitaxy (MOVPE), ultra-high vacuum chemical vapor deposition (UHVCVD), hydride vapor phase epitaxy (HYPE), or metal organic chemical vapor deposition (MOCVD).

A thickness of the first semiconductor layer 106 can be selected according to need. The thickness of the first semiconductor layer 106 can be in a range from about 1 μm to about 15 μm. In one embodiment, the thickness of the first semiconductor layer 106 is about 2 μm. The first semiconductor layer 106 includes an intrinsic semiconductor layer 101 and a doped semiconductor layer 111. The doped semiconductor layer 111 can be an N-type semiconductor layer or a P-type semiconductor layer. The N-type semiconductor layer provides electrons, and the P-type semiconductor layer provides cavities. The N-type semiconductor layer can be made of N-type gallium nitride, N-type gallium arsenide, or N-type copper phosphate. The P-type semiconductor layer can be made of P-type gallium nitride, P-type gallium arsenide, or P-type copper phosphate. In one embodiment, the doped semiconductor layer 111 is a Si-doped N-type gallium nitride semiconductor layer.

The active layer 108 is a photon exciting layer and can be a single quantum well layer or multilayer quantum well films. The active layer 108 can be made of gallium indium nitride (GaInN), aluminum indium gallium nitride (AlGaInN), gallium arsenide (GaSn), aluminum gallium arsenide (AlGaSn), gallium indium phosphide (GaInP), or aluminum gallium arsenide (GaInSn). The active layer 108, in which the cavities therein are filled by the electrons, can have a thickness of about 0.01 μm to about 0.6 μm. In one embodiment, the active layer 108 has a thickness of about 0.3 μm and includes a layer of InGaN/GaN.

The second semiconductor layer 110 can be an N-type semiconductor layer or a P-type semiconductor layer. The type of the second semiconductor layer 110 is different from the type of the first semiconductor layer 106. If the first semiconductor layer 106 is an N-type semiconductor, then the second semiconductor layer 110 is a P-type semiconductor, and vice versa. A thickness of the second semiconductor layer 110 is in a range from about 0.1 μm to about 3 μm. A surface of the second semiconductor layer 110, away from the substrate 102 can act as a light-emitting face. In one embodiment, the second semiconductor layer 110 can be an Mg-doped P-type gallium nitride semiconductor layer and a thickness of the second semiconductor layer 110 is about 0.3 μm.

In one embodiment, the first semiconductor layer 106 is prepared by metal organic chemical vapor deposition method. The carrier gas includes $H_2$, $N_2$ or a mixture thereof. The trimethyl gallium is used as Ga source, the silane is used as the silicon source, and ammonia is used as a nitrogen source gas. The method for making the first semiconductor layer 106 comprises the following steps:

S31, putting the substrate 102 with the carbon nanotube layer 104 thereon into a reaction chamber, flowing a carrier gas into the reaction chamber, and heating the reaction chamber to about 1100° C. to about 1200° C. for about 200 sec to about 1000 sec;

S32, growing a low-temperature GaN layer by cooling the reaction chamber to about 500° C. to about 650° C. and flowing trimethyl gallium and ammonia gas into the reaction chamber;

S33, stopping the flow of the trimethyl gallium, heating the reaction chamber to about 1100° C. to about 1200° C., and maintaining the temperature of the reaction chamber constant for about 30 seconds to about 300 seconds;

S34, maintaining the temperature of the reaction chamber in a range from about 1000° C. to about 1100° C. and the pressure in the reaction chamber at about 100 to about 300 torr.

S35, growing doped semiconductor layers 111 by maintaining the temperature of the reaction chamber at about 1000° C. to about 1100° C. and flowing silane into the reaction chamber.

In step S31, the carrier gas includes $H_2$, $N_2$, or a mixture thereof. The substrate 102 is sapphire.

In step S32, the trimethyl gallium can be substituted by the triethyl gallium. The low-temperature GaN layer is used as a buffer layer. A thickness of the low-temperature GaN layer is in a range from about 10 nm to about 50 nm. The low-temperature GaN layer can reduce the lattice mismatch between the first semiconductor layer 106 and the sapphire substrate 102. Therefore, the dislocation density of the first semiconductor layer 106 will be low. The material of the buffer layer can also be aluminium nitride.

In step S34, a high-temperature GaN layer is obtained. A thickness of the high-temperature GaN layer is in a range from about 200 nm to about 10 μm. The high-temperature GaN layer is used as an intrinsic semiconductor layer 101. The buffer layer, the intrinsic semiconductor layer 101, and the doped semiconductor layers 111 together, are defined as the first semiconductor layer 106.

The growth process of the first semiconductor layer 106 can be divided into the following stages:

First stage, nucleating on the epitaxial growth surface 122 and growing a plurality of epitaxial crystal grains along a direction substantially perpendicular to the epitaxial growth surface 122.

Second stage, forming a continuous epitaxial film by growing the epitaxial crystal grains along a direction substantially parallel to the epitaxial growth surface 122.

Third stage, forming a high-grade epitaxial film by growing the epitaxial film along the direction substantially perpendicular to the epitaxial growth surface 122.

In the first stage, the epitaxial crystal grains grow from the exposed part of the epitaxial growth surface 122 and through the apertures 105. The growth of the epitaxial crystal grains along the direction substantially perpendicular to the epitaxial growth surface 122 is called vertical epitaxial growth.

In the second stage, the epitaxial crystal grains are joined together to form an integral structure to cover the carbon nanotube layer 104. The epitaxial crystal grains grow and form a plurality of channels 103 to enclose the carbon nanotubes of the carbon nanotube layer 104. The inner wall of the channels 103 can be in contact with the carbon nanotubes or spaced from the carbon nanotubes, depending on whether the material of the epitaxial film and the carbon nanotubes have mutual infiltration. Thus, the epitaxial film defines a patterned depression on the surface adjacent to the epitaxial growth surface 122. The patterned depression corresponds to the patterned carbon nanotube layer 104. If the carbon nanotube layer 104 includes a layer of parallel and spaced carbon nanotube wires, the patterned depression is a plurality of parallel and spaced grooves. If the first carbon nanotube layer 104 includes a plurality of carbon nanotube wires crossed, or weaved together to form a carbon nanotube net, the patterned depression is a groove network including a plurality of cross-set grooves. The cross section of the channel 103 can be geometrically shaped. The biggest diameter of the channel 103 is in a range from about 20 nm to about 200 nm. In one embodiment, the biggest diameter of the channel 103 is in a range from about 50 nm to about 100 nm. The carbon nanotube layer 104 can prevent lattice dislocations between the epitaxial crystal grains and the substrate 102 from growing. The growth of epitaxial crystal grains along the direction substantially parallel to the epitaxial growth surface 122 is called lateral epitaxial growth.

In the third stage, the first semiconductor layer 106 is obtained. The epitaxial crystal grains, the epitaxial film and the high-grade epitaxial film constitute the first semiconductor layer 106. Because the carbon nanotube layer 104 can prevent the lattice dislocation between the epitaxial crystal grains and the substrate 102 from growing in step (302), the first semiconductor layer 106 has less defects therein.

A method for growing the active layer 108 is similar to the method for growing the first semiconductor layer 106. The active layer 108 is grown after growing the first semiconductor layer 106 is grown. In one embodiment, the method for growing the active layer 108 includes the following steps.

Step a1, stopping the flow of the silane into the reaction chamber after step S35 of growing the first semiconductor layer 106, heating the reaction chamber to a temperature of about 700° C. to about 900° C., and maintaining the pressure of the reaction chamber at about 6666.1184 Pa (50 torr) to about 66661.184 Pa (500 torr).

Step a2, forming the active layer 108 by flowing trimethyl indium into the reaction chamber to grow InGaN/GaN multi-quantum well layer.

A method for growing the second semiconductor layer 110 is similar to the method for growing the first semiconductor layer 106. The second semiconductor layer 110 is grown after growing the active layer 108. In one embodiment, the method for growing the second semiconductor layer 110 includes the following steps.

Step b1, stopping the flow of the trimethyl indium into the reaction chamber after step a2 of growing the active layer 108, heating the reaction chamber to a temperature of about 1000° C. to about 1100° C. and maintaining the pressure of the reaction chamber at about 10132.5 Pa (76 torr) to about 26664.47 Pa (200 torr).

Step b2, forming the second semiconductor layer 110 by flowing ferrocene magnesium into the reaction chamber to grow Mg-doped P-type GaN layer.

Figure 7:
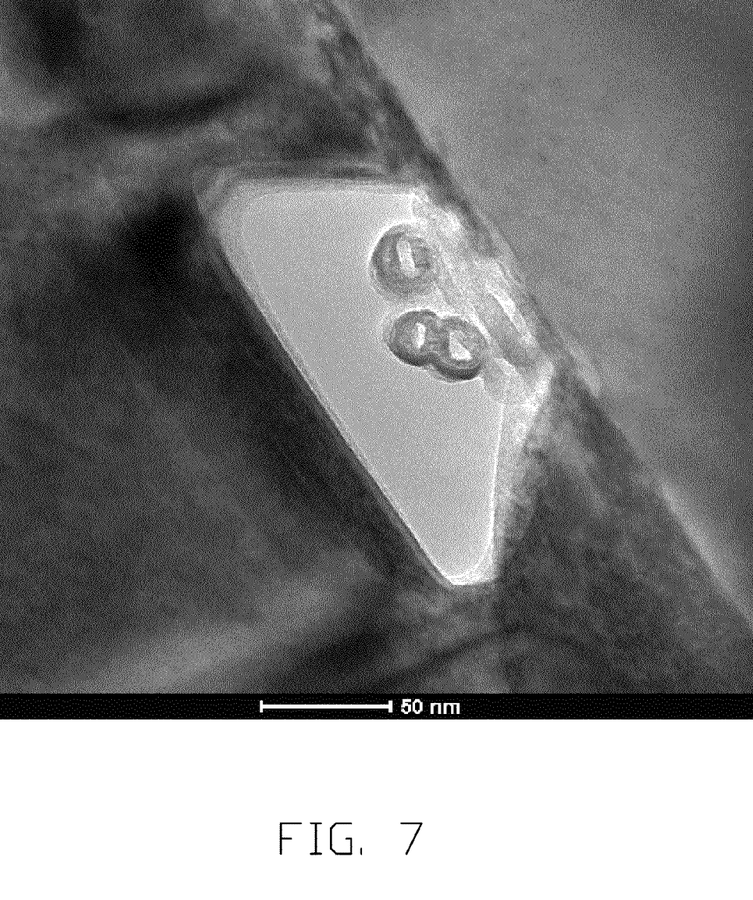
FIG. 7 is a transmission electron microscopy (TEM) of a cross-sectional view of a first semiconductor layer and a substrate of the LED made by the method in FIG. 1.

After the second semiconductor layer 110 is obtained, a cross section between the substrate 102 and the first semiconductor layer 106 is observed and tested by a TEM. Referring to FIG. 7, a light-colored portion in the TEM picture is the sapphire substrate 102, and a dark-colored portion in the TEM picture is the first semiconductor layer 106. The first semiconductor layer 106 only grows from a portion of the epitaxial growth surface 122 exposed by the apertures 105 of the carbon nanotube layer 104. A number of channels are defined between the substrate 102 and the first semiconductor layer 106. The carbon nanotubes are located in the channels and spaced from the first semiconductor layer 106.

Furthermore, a highly doped semiconductor electrode contact layer can be located on a top surface of the second semiconductor layer 110. The highly doped semiconductor electrode contact layer can be obtained by a method similar to the method for making the second semiconductor layer 110, and the only difference is to change the content of doping elements in the source gas during the growing progress.

In step S40, the second semiconductor layer 110, and the active layer 108 are etched by a reactive ion etching. After the active layer 108 is etched, the first semiconductor layer 106 can also be etched by the reactive ion etching. After the first semiconductor layer 106 is etched, the carbon nanotube layer 104 becomes covered by the semiconductor layer 106. The substrate 102, the carbon nanotube layer 104, the first semiconductor layer 106, the active layer 108 and the second semiconductor layer 110 constitute a LED chip.

In one embodiment, the active layer 108 is made of InGaN/GaN layer and the second semiconductor layer 110 is made of P-type GaN layer, the second semiconductor layer 110 and the active layer 108 can be etched by placing the LED chip into an inductively coupled plasma device, and adding a mixture of silicon tetrachloride and chlorine into the inductively coupled plasma device. In one embodiment, the power of the inductively coupled plasma device is about 50 W, the speed of the chlorine is about 26 sccm, and the speed of the silicon tetrachloride is about 4 sccm. The partial pressure of the silicon tetrachloride and chlorine is about 2 Pa. The etched thickness of the second semiconductor layer 110 is about 0.3 μm. The etched thickness of the active layer 108 is about 0.3 μm.

In step S50, the first electrode 114 is located on the exposed surface of the first semiconductor layer 106, and the second electrode 112 is located on a top surface of the second semiconductor layer 110. The first electrode 114 may be a P-type or an N-type electrode, and is the same type as the first semiconductor layer 106. The second electrode 112 may be a P-type or an N-type electrode, and is the same type as the second semiconductor layer 110.

A thickness of the first electrode 114 can range from about 0.01 μm to about 2 μm. A thickness of the second electrode 112 can range from about 0.01 μm to about 2 μm. The first electrode 114 can be made of titanium, aluminum, nickel, gold, or a combination thereof. In one embodiment, the first electrode 114 is an N-type electrode and includes a nickel layer and a gold layer. A thickness of the nickel layer is about 150 angstroms (Å). A thickness of the gold layer is about 1000 Å. In one embodiment, the second electrode 112 is a P-type electrode and includes a titanium layer and a gold layer. A thickness of the titanium layer is about 150 Å. A thickness of the gold layer is about 2000 Å.

The above method for making the LED described-above has many benefits. First, the carbon nanotube layer 104 is a free-standing structure, therefore, the carbon nanotube layer 104 can be laid directly on the substrate 102 directly without difficulty. Second, the channels 103 are formed between the first semiconductor layer 106 and the substrate 102 without etching to avoid damage to the lattice structure of the LED.

Figure 8:
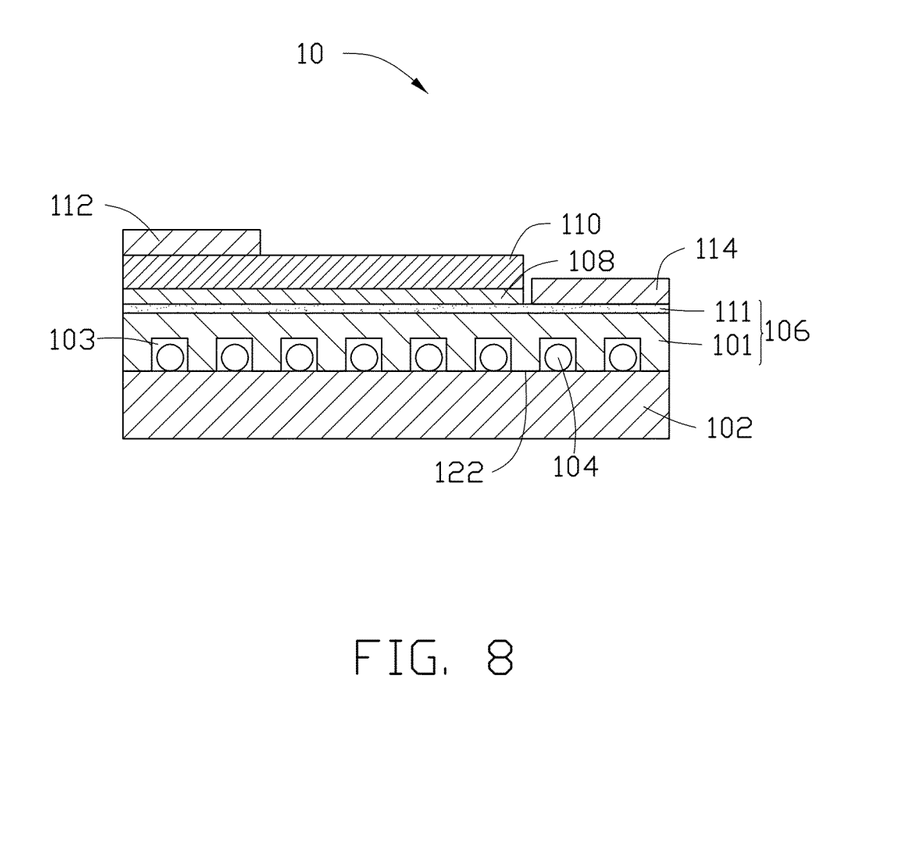
FIG. 8 is a schematic structural view of an LED made by the method in FIG. 1

Referring to FIG. 8, a LED 10 is illustrated in one embodiment. The LED 10 includes a substrate 102, a carbon nanotube layer 104, a first semiconductor layer 106, an active layer 108, a second semiconductor layer 110, a first electrode 114, and a second electrode 112. The first semiconductor layer 106, the active layer 108, and the second semiconductor layer 110 are orderly stacked on one side of the substrate 102. The first semiconductor layer 106 is adjacent to the substrate 102. The carbon nanotube layer 104 is located between the first semiconductor layer 106 and the substrate 102. The first electrode 114 is electrically connected to the first semiconductor layer 106. The second electrode 112 is electrically connected to the second semiconductor layer 110.

The substrate 102 has an epitaxial growth surface 122. The carbon nanotube layer 104 is located on the epitaxial growth surface 122. The carbon nanotube layer 104 has a number of apertures 105. The epitaxial growth surface 122 is exposed by the apertures 105 of the carbon nanotube layer 104.

The first semiconductor layer 106 is located on and covers the epitaxial growth surface 122. The first semiconductor layer 106 is permeated into the apertures 105 of the carbon nanotube layer 104 and contacted with the epitaxial growth surface 122. All of the apertures of the carbon nanotube layer 104 are filled with the first semiconductor layer 106. A patterned depression is formed on a surface of the first semiconductor layer 106 adjacent to the substrate 102. The depression is covered by the substrate 102. A number of channels 103 are formed between the first semiconductor layer 106 and the substrate 102. The carbon nanotubes are located in the channels 103. The carbon nanotubes are spaced from the first semiconductor layer 106. The carbon nanotubes located in each of the channels 103 form the carbon nanotube layer 104. The cross section of the channels 103 can be geometrically shaped. A diameter of the channels 103 is in a range from about 20 nm to about 200 nm. In one embodiment, the diameter of the channels 103 is in a range from about 50 nm to about 100 nm.

The carbon nanotube layer 104 is a free-standing structure. The carbon nanotube layer 104 includes at least one carbon nanotube film or a number of carbon nanotube wires. The carbon nanotube wires can be twisted carbon nanotube wires or untwisted carbon nanotube wires. The untwisted carbon nanotube wire includes a plurality of carbon nanotubes substantially oriented along a direction along the length of the untwisted carbon nanotube wire. The twisted carbon nanotube wire includes a plurality of carbon nanotubes oriented around an axial direction of the twisted carbon nanotube wire. The carbon nanotube wires can also be crossed with each other or woven together to form a network structure. In one embodiment, the carbon nanotube layer 104 is a single carbon nanotube film including a number of carbon nanotubes. Axial directions of the carbon nanotubes in the carbon nanotube film can be oriented along a direction. The carbon nanotubes are joined end to end by van der Waals attractive force along the oriented direction. The carbon nanotubes may be spaced apart from each other substantially perpendicular to the axial direction and form a number of apertures 105 substantially parallel to each other in the carbon nanotube layer 104 and, the channels 103 are a plurality of trip channels paralleled to and spaced apart from each other. If the carbon nanotube layer 104 is composed of a number of carbon nanotube wires substantially parallel to each other, a number of apertures 105 substantially parallel to each other may be formed in the carbon nanotube layer 104, and the channels 103 are a plurality of trip channels paralleled to and spaced apart from each other. If the carbon nanotube layer 104 is composed of carbon nanotube wires crossed with each other or a number of cross-stacked carbon nanotube film, a number of apertures are arranged in an array formed in the carbon nanotube layer 104. If the carbon nanotube layer 104 is composed of a number of cross-stacked carbon nanotube film, angle defined between the carbon nanotubes in two adjacent carbon nanotube films is bigger than 0 degrees and less than 90 degrees. Then, the channels 103 arranged in the array are interconnected and coplanar.

The LED described-above has many benefits. First, because a number of channels 103 exist between the first semiconductor layer 106 and the substrate 102, the channels 103 can scatter lights emitted from the active layer 108 and improve the light extracting rate of the LED. Second, because the carbon nanotube layer 104 has good thermal conductivity, the carbon nanotube layer 104 can conduct heat produced in the LED, thereby prolonging the life of the LED.

It is to be understood that the above-described embodiments are intended to illustrate rather than limit the disclosure. Any elements described in accordance with any embodiments is understood that they can be used in addition or substituted in other embodiments. Embodiments can also be used together. Variations may be made to the embodiments without departing from the spirit of the disclosure. The above-described embodiments illustrate the scope of the disclosure but do not restrict the scope of the disclosure.

Depending on the embodiment, certain of the steps of methods described may be removed, others may be added, and the sequence of steps may be altered. It is also to be understood that the description and the claims drawn to a method may include some indication in reference to certain steps. However, the indication used is only to be viewed for identification purposes and not as a suggestion as to an order for the steps.

What is claimed is:

1. A light emitting diode comprising:
a substrate;
a first semiconductor layer stacked on the substrate, wherein the first semiconductor layer comprises an intrinsic semiconductor layer and a doped semiconductor layer stacked with the intrinsic semiconductor layer;
an active layer stacked on the first semiconductor layer;
a second semiconductor layer stacked on the active layer;
a first electrode electrically connected to the first semiconductor layer;
a second electrode electrically connected to the second semiconductor layer; and
a carbon nanotube layer disposed between the first semiconductor layer and the substrate;
wherein the substrate has an epitaxial growth surface, and the carbon nanotube layer is a free-standing structure directly disposed on the epitaxial growth surface of the substrate.

2. The light emitting diode of claim 1, wherein the carbon nanotube layer defines a plurality of apertures, and the first semiconductor layer penetrates through the apertures and contacts the substrate.

3. The light emitting diode of claim 2, wherein the carbon nanotube layer comprises at least one carbon nanotube film comprising a plurality of carbon nanotubes or a plurality of carbon nanotube wires comprising a plurality of carbon nanotubes.

4. The light emitting diode of claim 3, wherein the carbon nanotube layer is one carbon nanotube film, and axial directions of the carbon nanotubes of the carbon nanotube film are substantially oriented along one direction.

5. The light emitting diode of claim 3, wherein the carbon nanotube layer comprises 2 to 100 hundred stacked carbon nanotube films.

6. The light emitting diode of claim 5, wherein the carbon nanotubes films are cross-stacked.

7. The light emitting diode of claim 3, wherein the carbon nanotube layer comprises a plurality of carbon nanotube wires substantially parallel to and spaced apart from each other.

8. The light emitting diode of claim 3, wherein the carbon nanotube layer comprises a plurality of carbon nanotube wires crossed with each other or woven together to form a network structure.

9. The light emitting diode of claim 3, wherein each of the apertures is a gap defined by two substantially parallel carbon nanotubes and extends along axial directions of the carbon nanotubes.

10. The light emitting diode of claim 3, wherein each of the apertures is a hole defined by several adjacent carbon nanotubes.

11. The light emitting diode of claim 3, wherein the carbon nanotube layer defines a pattern, the first semiconductor layer having a surface and a patterned depression defined on the surface of the first semiconductor layer adjacent to the substrate, and the pattern of the patterned depression is substantially the same as the pattern of the carbon nanotube layer.

12. The light emitting diode of claim 11, wherein the patterned depression is a plurality of grooves, and the carbon nanotubes are located in and semi-enclosed by the grooves and spaced from the inner wall of the grooves defined in the first semiconductor layer.

13. The light emitting diode of claim 12, wherein the grooves are substantially parallel to and spaced from each other.

14. The light emitting diode of claim 12, wherein the grooves are crossed with each other or woven together to form a groove network.

15. The light emitting diode of claim 11, wherein the patterned depression defined in the first semiconductor layer is covered by the substrate and a plurality of channels are formed between the first semiconductor layer and the substrate.

16. The light emitting diode of claim 15, wherein the carbon nanotubes are located in the channels and spaced apart from the inner wall of the first semiconductor layer.

17. The light emitting diode of claim 15, wherein a diameter of the cross section of the channels is in a range from about 20 nm to about 200 nm.

18. A light emitting diode comprising:
a substrate;
a first semiconductor layer stacked on the substrate, wherein the first semiconductor layer comprises an intrinsic semiconductor layer and a doped semiconductor layer stacked with the intrinsic semiconductor layer;
an active layer stacked on the first semiconductor layer;
a second semiconductor layer stacked on the active layer;
a first electrode electrically connected to the first semiconductor layer;
a second electrode electrically connected to the second semiconductor layer; and
a carbon nanotube layer disposed between the first semiconductor layer and the substrate,
wherein the carbon nanotube layer defines a plurality of apertures, and the intrinsic semiconductor layer of the first semiconductor layer penetrates through the apertures and contacts the substrate.

19. A light emitting diode comprising:
a substrate;
a first semiconductor layer stacked on the substrate, wherein the first semiconductor layer comprises an intrinsic semiconductor layer and a doped semiconductor layer stacked with the intrinsic semiconductor layer, and a patterned depression is defined in the intrinsic semiconductor layer;
an active layer stacked on the first semiconductor layer;
a second semiconductor layer stacked on the active layer;
a first electrode electrically connected to the first semiconductor layer;
a second electrode electrically connected to the second semiconductor layer; and
a carbon nanotube layer disposed in the patterned depression;
wherein the patterned depression is covered by the substrate and a plurality of channels are formed between the first semiconductor layer and the substrate.

20. The light emitting diode of claim 1, wherein the carbon nanotube layer is disposed between the intrinsic semiconductor layer and the substrate and directly contacts with the intrinsic semiconductor layer and the substrate.

* * * * *